US012579912B2

(12) United States Patent
Hu et al.

(10) Patent No.: US 12,579,912 B2
(45) Date of Patent: Mar. 17, 2026

(54) DISPLAY MODULE AND MANUFACTURING METHOD THEREFOR

(71) Applicant: Wuhan China Star Optoelectronics Semiconductor Display Technology Co., Ltd., Wuhan (CN)

(72) Inventors: Peng Hu, Wuhan (CN); Yanqiang Duan, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 743 days.

(21) Appl. No.: 17/606,767

(22) PCT Filed: Sep. 3, 2021

(86) PCT No.: PCT/CN2021/116465
§ 371 (c)(1),
(2) Date: Oct. 27, 2021

(87) PCT Pub. No.: WO2023/010642
PCT Pub. Date: Feb. 9, 2023

(65) Prior Publication Data
US 2024/0038101 A1 Feb. 1, 2024

(30) Foreign Application Priority Data

Aug. 2, 2021 (CN) .......................... 202110879064.3

(51) Int. Cl.
*H05K 5/02* (2006.01)
*G09F 9/30* (2006.01)
*H05K 7/20* (2006.01)

(52) U.S. Cl.
CPC ......... *G09F 9/301* (2013.01); *H05K 7/20963* (2013.01)

(58) Field of Classification Search
CPC ............................. H05K 5/02; H05K 7/20963
USPC .......................................................... 428/212
See application file for complete search history.

(56) References Cited

U.S. PATENT DOCUMENTS

| | | | |
|---|---|---|---|
| 2010/0171683 A1 | 7/2010 | Huitema et al. | |
| 2019/0219863 A1* | 7/2019 | Tezen .................. | G02F 1/13454 |
| 2020/0194716 A1* | 6/2020 | Chen .................. | H10K 50/8428 |
| 2022/0006043 A1* | 1/2022 | E .............................. | B32B 37/30 |
| 2022/0159845 A1* | 5/2022 | Feng ..................... | G06F 1/1616 |

FOREIGN PATENT DOCUMENTS

| | | | | |
|---|---|---|---|---|
| CN | 108877514 | 11/2018 | | |
| CN | 108898954 | 11/2018 | | |
| CN | 109994606 | 7/2019 | | |
| CN | 110310577 | 10/2019 | | |
| CN | 110429108 | 11/2019 | | |
| CN | 110429108 A | * 11/2019 | ......... | H01L 27/3244 |
| CN | 112150921 | 12/2020 | | |

(Continued)

*Primary Examiner* — Tahseen Khan

(57) ABSTRACT

The present disclosure disclosures a display module and a manufacturing method therefor. The display module includes a bending area, a display panel, and a back panel disposed on a side of the display panel. The back panel includes a substrate. The substrate includes a first part and a second part. The second part is disposed closer to the bending area of the display module than the first part. Stiffness of the second part is greater than stiffness of the first part.

14 Claims, 10 Drawing Sheets

(56)        References Cited

FOREIGN PATENT DOCUMENTS

| CN | 112150921  A  * 12/2020 | ............. G09F 9/301 |
|----|-------------------------|-------------------------|
| CN | 112341949               | 2/2021                  |
| CN | 112863338               | 5/2021                  |
| CN | 113192420               | 7/2021                  |
| JP | 2010-276934             | 12/2010                 |

* cited by examiner

DISPLAY MODULE AND MANUFACTURING METHOD THEREFOR

RELATED APPLICATIONS

This application is a National Phase of PCT Patent Application No. PCT/CN2021/116465 having International filing date of Sep. 3, 2021, which claims the benefit of priority of Chinese Patent Application No. 202110879064.3 filed on Aug. 2, 2021. The contents of the above applications are all incorporated by reference as if fully set forth herein in their entirety.

FIELD AND BACKGROUND OF THE INVENTION

The present disclosure relates to display technologies, and more particularly, to a display module and a manufacturing method therefor.

Flexible display products have gradually become a new trend in the market. In order to improve the bending/curving performance of flexible display products, the industry generally adopts the method of thinning the back panel. For example, in the foldable display products, an ultra-thin back panel is used to replace the traditional relatively thick back panel. However, when the back panel is thinned, the stiffness of the back panel will decrease accordingly. Therefore, after the bending operation, the back panel is prone to collapse at end portions close to the bending area of the display module due to insufficient stiffness. This results in cracks or even breakage of the display panel due to the collapse of the back panel.

SUMMARY OF THE INVENTION

The present disclosure provides a display module and a manufacturing method therefor, so as to resolve the technical problem of cracks or even breakage of the display panel as a result of the collapse of the back panel due to insufficient stiffness of the back panel after the conventional display module is bent.

To resolve the foregoing problem, the technical solutions adopted by the present disclosure are as follows:

A display module includes a bending area, a display panel, and a back panel disposed on a side of the display panel, wherein the back panel includes a substrate, the substrate is formed by splicing a first part and a second part, the second part is disposed closer to a terminal area of the display panel than the first part, and stiffness of the second part is greater than stiffness of the first part.

Further, a thickness of the second part is greater than a thickness of the first part. Further, the display panel includes a display area and a non-display area, the bending area is located in the non-display area, the first part is disposed corresponding to the display area, the second part is disposed corresponding to the non-display area, a strip-shaped opening is provided on the second part, and the strip-shaped opening is provided corresponding to the bending area.

Further, the thickness of the second part is in a range of 70 μm to 100 μm, and the thickness of the first part is in a range of 10 μm to 50 μm.

Further, the thickness of the second part is twice the thickness of the first part.

Further, the first part and the second part have a same material.

Further, a material of the first part is polyimide (PI), and a material of the second part is selected from any of polyethylene terephthalate (PET), an optical cyclo olefin polymer (COP) material, an SRF material, and polyurethane (PU).

Further, the display panel includes a display area and a non-display area, the bending area is located in the non-display area, the first part is disposed corresponding to the display area, the second part is disposed at least corresponding to the non-display area, a strip-shaped opening is provided on the second part, and the strip-shaped opening is provided corresponding to the bending area.

Further, the second part is disposed corresponding to the non-display area and a part of the display area, and a width by which the second part corresponds to the part of the display area is in a range of 100 μm to 150 μm.

Further, the display module further includes a heat dissipation and buffer film layer attached to one side surfaces of the first part and the second part that face away from the display panel.

A manufacturing method for a display module includes steps of:

providing a display panel and a back panel, wherein the back panel includes a substrate, the substrate includes a first part and a second part, and stiffness of the second part is greater than stiffness of the first part; and attaching the back panel to a side of the display panel, wherein the second part is closer to a bending area of a display module than the first part.

Further, the back panel further includes a protective film and a release film, the first part and the second part are disposed between the release film and the protective film, and the step of attaching the back panel to the side of the display panel includes:

tearing off the protective film of the back panel, and attaching a side of the back panel that faces the protective film to the side of the display panel; and tearing off the release film of the back panel.

Further, a filling portion is further disposed between the first part and the protective film, a sum of thicknesses of the first part and the filling portion is equal to a thickness of the second part, and a viscosity between the filling portion and the first part is less than a viscosity between the filling portion and the protective film.

Beneficial effects of the present disclosure are as follows. In the display module and the manufacturing method therefor provided in the present disclosure, the substrate part of the back panel includes a first part and a second part. The stiffness of the second part is greater than the stiffness of the first part. When the back panel is applied to the display module, the second part is disposed closer to the bending area of the display module than the first part. In this way, the stiffness of the back panel close to an end portion of the bending area is effectively enhanced, thereby effectively improving the collapse of the back panel due to insufficient stiffness, and preventing the display panel from cracking or even breaking.

BRIEF DESCRIPTION OF THE SEVERAL VIEWS OF THE DRAWINGS

To describe the technical solutions of the embodiments of the present disclosure more clearly, the following briefly introduces the accompanying drawings required for describing the embodiments. Apparently, the accompanying drawings in the following description show only some embodiments of the present disclosure, and a person skilled in the art may still derive other drawings according to these accompanying drawings without creative efforts.

DESCRIPTIONS OF REFERENCE NUMERALS

Figure 1:
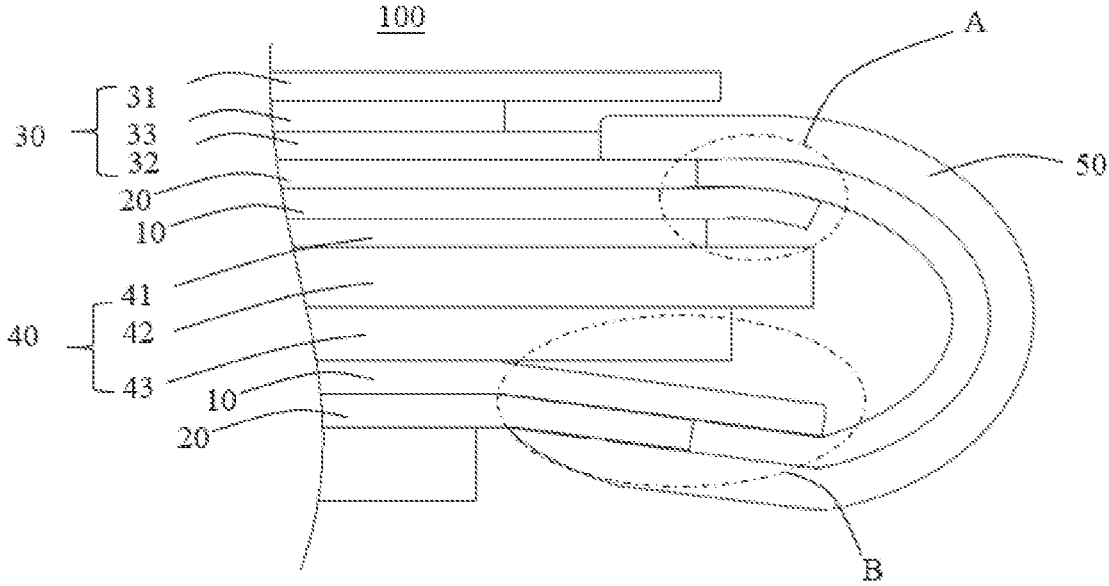
FIG. 1 is a schematic diagram of a structure of a display module according to the prior art.

Display module 100
Back panel 10
Substrate 11
First part 111
Second part 112
Strip-shaped opening 113
Protective film 12
Release film 13
Filling portion 14
Display panel 20
Display area AA
Non-display area NA
Bending area BA
First module stack 30
Cover plate 31
Polarizer 32
Optical adhesive 33
Protective layer 34
Ultra-thin glass 35
Base 36
Second module stack 40
Heat dissipation and buffer film layer 41
Steel plate 42
Reinforcement layer 43
UV adhesive layer 50
Flexible circuit board 60

DESCRIPTION OF SPECIFIC EMBODIMENTS OF THE INVENTION

The technical solutions in the embodiments of the present disclosure are clearly and completely described below with reference to the accompanying drawings in the embodiments of the present disclosure. Apparently, the described embodiments are merely some rather than all of the embodiments of the present disclosure. All other embodiments obtained by a person skilled in the art based on the embodiments of the present disclosure without creative efforts shall fall within the protection scope of the present disclosure. In addition, it should be understood that the specific implementations described herein are merely used for describing and illustrating the present disclosure, but are not intended to limit the present disclosure. In the present disclosure, without the contrary explanation, the directional terms such as "above" and "below" generally refer to "above" and "below" in actual use or a working state of a device, and specifically refer to drawing directions of the corresponding accompanying drawings; and "inside" and "outside" are relative to the contour of the device.

The back panel of the flexible display module in the prior art is usually thinned to improve the bending/curving performance of the display module, especially foldable products. However, the display module of this type of product is close to the bending area of the display module after the bending operation, and the back panel is prone to collapse at its end portions due to insufficient stiffness. Taking the display module 100 shown in FIG. 1 as an example, the pad bending technology is adopted. As shown by circles A and B in the figure, in the bending area close to the display module 100, the back panel 10 is prone to collapse at its ends due to the insufficient stiffness of the back panel, causing the display panel 20 to crack or even break due to the collapse of the back panel 10.

In order to resolve the foregoing technical problem, the present disclosure provides a new display module. FIGS. 1 to 10 are schematic diagrams of structures of a display module 100 according to the present disclosure. It should be noted that the structure diagrams in FIGS. 1 to 10 are merely schematic diagrams, which are only used to show relative positions of each structure. The size of each structure in the drawing file is schematic, not the actual size. The size relationship of the each structure is not limited in the drawing file.

Referring to FIGS. 4, 5, 9, and 10, the display module 100 includes a display panel and a back panel 10. The back panel 10 is disposed on a side of the display panel 20. The display module 100 includes a bending area BA. The back panel 10 includes a substrate 11. The substrate 11 includes a first part 111 and a second part 112. The second part 112 is disposed closer to the bending area BA than the first part 111. Stiffness of the second part 112 is greater than stiffness of the first part 111.

The present disclosure designs the back panel 10. The substrate 11 of the back panel includes a first part 111 and a second part 112. The stiffness of the second part 112 is greater than the stiffness of the first part 111. When the back panel 10 is applied to the display module 100, the second part 112 is disposed closer to the bending area BA of the display module 100 than the first part 111. In this way, the stiffness of the back panel 10 close to an end portion of the bending area BA is effectively enhanced, thereby effectively improving the collapse of the back panel 10 due to insufficient stiffness, and preventing the display panel 20 from cracking or even breaking.

Detailed embodiments of the display module 100 and the back panel 10 provided in the present disclosure are described below.

Embodiment I

Figure 2:
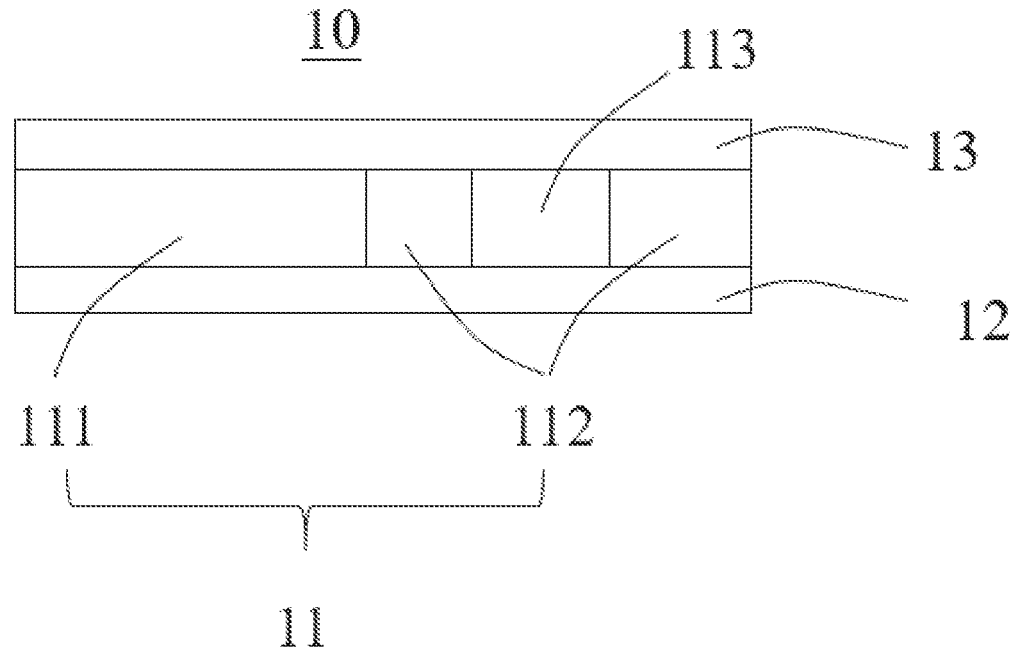
FIG. 2 is a schematic diagram of a structure of a back panel according to a first embodiment of the present disclosure.
Figure 3:
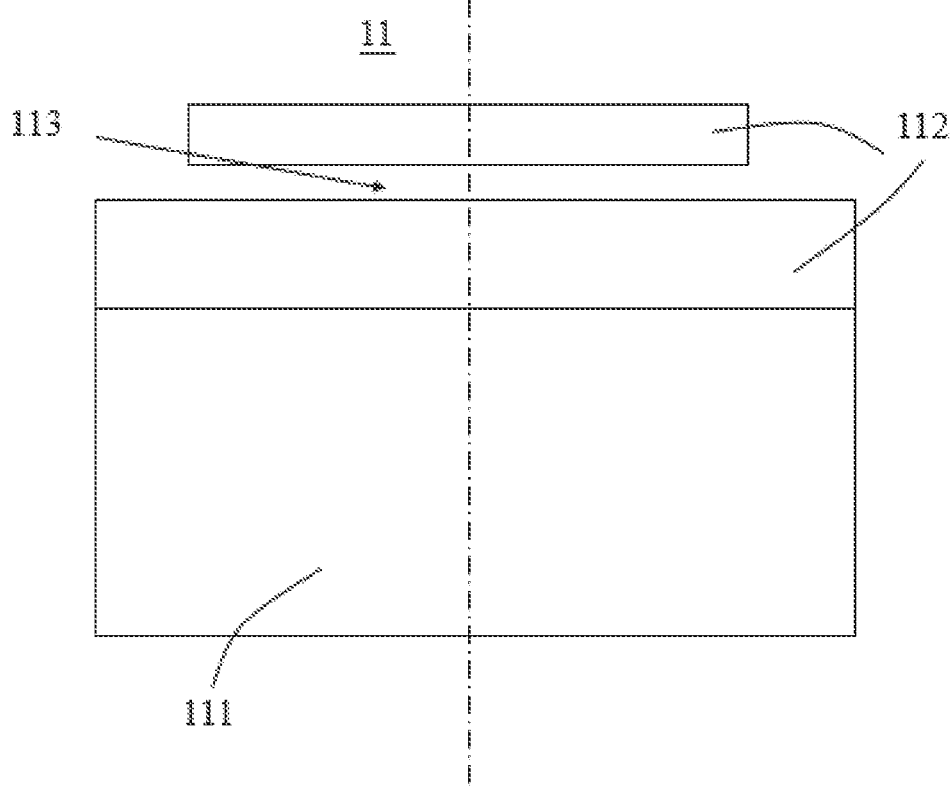
FIG. 3 is a plan view of a substrate of the back panel shown in FIG. 2.

Referring to FIGS. 2 and 3, the back panel 10 provided in the present embodiment includes a substrate 11, a protective film 12, and a release film 13. The substrate 11 is sandwiched between the protective film 12 and the release film 13. The substrate 11 includes a first part 111 and a second part 112. Stiffness of the second part 112 is greater than stiffness of the first part 111. The first part 111 and the second part 112 are spliced to form the substrate 11.

In the present embodiment, a thickness of the first part 111 is equal to a thickness of the second part 112. The first part 111 adopts PI, and a material of the second part 112 is selected from any of PET, an optical COP material, an SRF material, and polyurethane. It may be understood that in other embodiments, the materials of the first part 111 and the second part 112 may also adopt other configurations, as long as the stiffness requirements are met.

Figure 4:
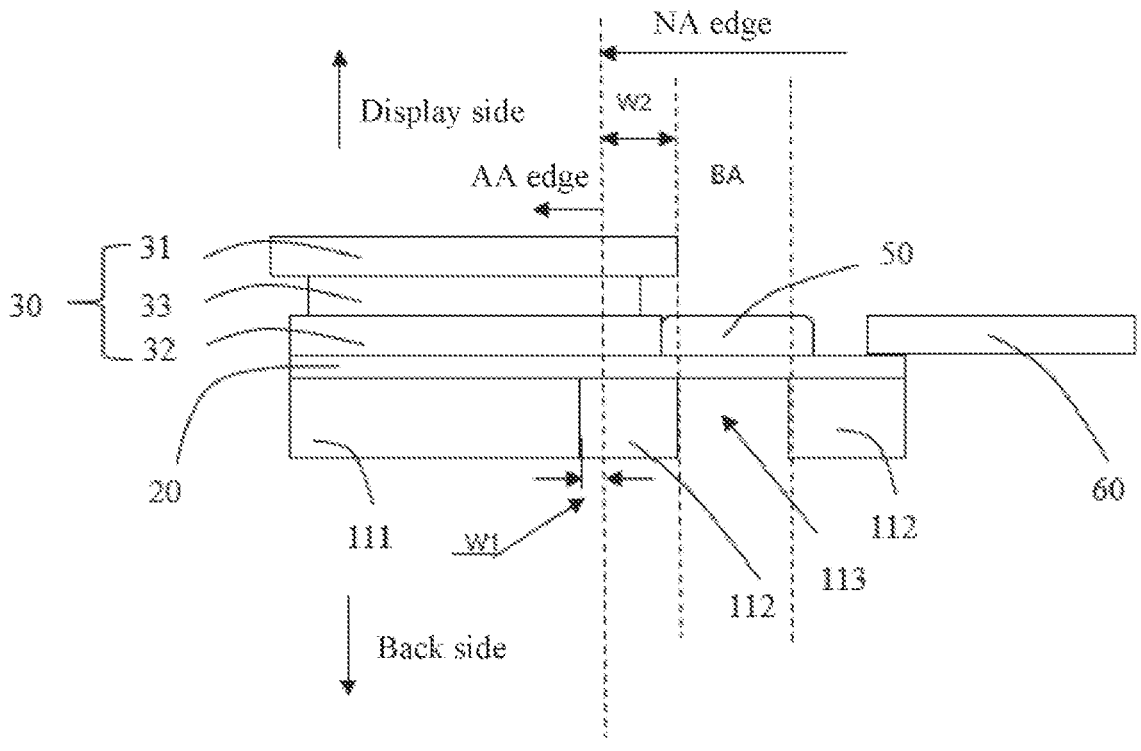
FIG. 4 is a schematic diagram of a part of a structure of a display module before being bent according to a first embodiment of the present disclosure.
Figure 5:
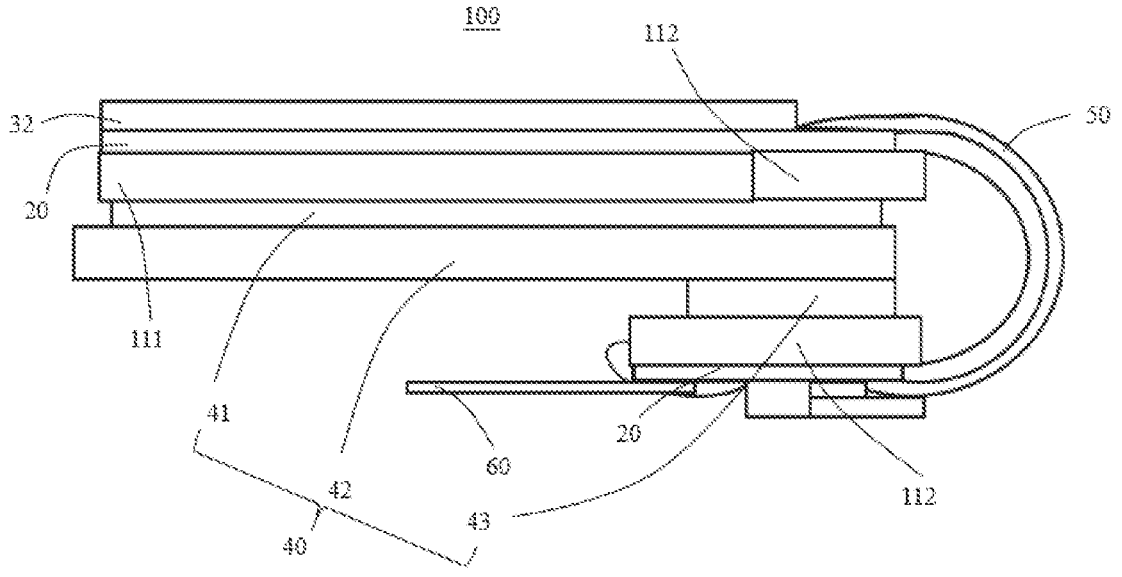
FIG. 5 is a schematic diagram of a structure of the display module shown in FIG. 4 after being bent.

FIGS. 4 and 5 are schematic diagrams of a part of a structure of the display module 100 before and after being bent according to the present embodiment. The display module 100 includes the back panel 10 and the display panel 20 described above. The back panel 10 is disposed on a side of the display panel 20. The display module 100 further includes a first module stack 30 disposed on a side of the display panel 20 that faces away from the back panel 10 and a second module stack 40 disposed on a side of the back panel 10 that faces away from the display panel 20.

Referring to FIGS. 4 and 5, the display module 100 provided in the present embodiment adopts a pad bending technology and includes a bending area BA. It may be understood that in other embodiments, the display module 100 may also use other bending technologies. The display panel 20 includes a display area AA and a non-display area NA. The bending area BA is located in the non-display area NA and is spaced from an edge of the display area AA. The first part 111 of the back panel 10 is disposed corresponding to the display area AA. The second part 112 of the back panel 10 is disposed at least corresponding to the non-display area NA. A strip-shaped opening 113 is provided on the second part 112. The strip-shaped opening 113 is provided corresponding to the bending area BA. The strip-shaped opening 113 divides the second part 112 into a back-bent part and a non-back-bent part. For ease of description, a side of the display module 100 that is used for display is defined as a display side, and a side opposite to the display side is defined as a back side. The non-back-bent part supports the display panel 20 toward the display side, and the back-bent part supports the display panel 20 toward the back side.

Preferably, the second part 112 is not only disposed corresponding to the non-display area NA, but also disposed corresponding to a part of the display area AA, so as to further enhance its stiffness. In the present embodiment, a width range W1 of a part of the second part 112 corresponding to the display area AA is 100 μm to 150 μm, so as to improve the bending performance of the first part 111 of the display module 100 while further enhancing the stiffness of the second part 112, so as to meet the requirements of flexible display devices, especially foldable products for the bending performance. A width range W2 of a part of the non-back-bent part of the second part 112 corresponding to the non-display area NA is 900 μm to 1500 μm. In the present embodiment, the first module stack 30 includes a cover plate 31 disposed on the display side of the display panel 20 and a polarizer 32 adhered to an inner side of the cover plate 31 by using an optical adhesive 33. It may be understood that in other embodiments, the first module stack 30 may further adopt other combination modes, which may be set in detail according to product requirements.

Figure 6:
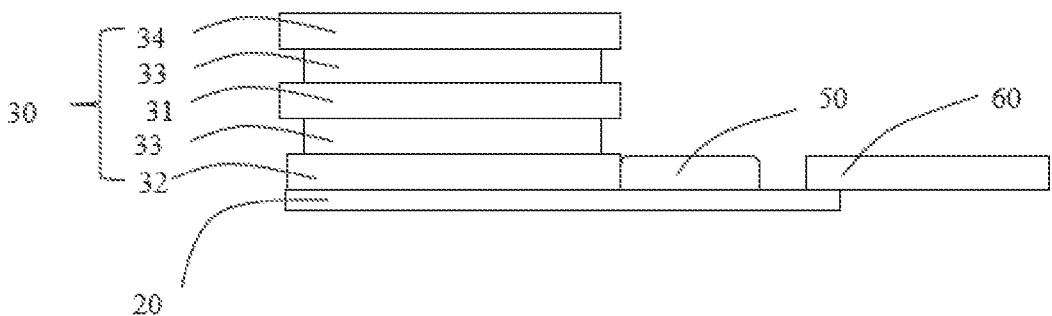
FIGS. 6 and 7 are schematic diagrams of structures of a first module stack of the display module in other embodiments according to the present disclosure.

As shown in FIG. 6, the first module stack 30 may further be composed of the cover plate 31 disposed on the display side of the display panel 20, a polarizer 32 adhered to the inner side of the cover plate 31 by using an optical adhesive 33, and a protective layer 34 adhered to an outer side of the cover plate 31 by using the optical adhesive 33.

Figure 7:
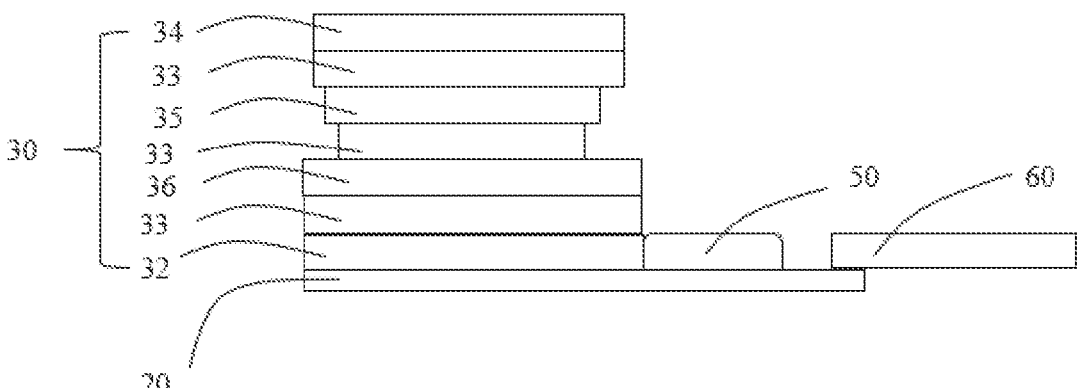

As shown in FIG. 7, the first module stack 30 may further be composed of a base 36, ultra-thin glass 35 adhered to a display side of the base 36 by using the optical adhesive 33, a polarizer 32 adhered to a back side of the base 36 by using the optical adhesive 33, and a protective layer 34 adhered to a display side of the ultra-thin glass 35 by using the optical adhesive 33.

The second module stack 40 is conventionally disposed to support the display panel 20. In the present embodiment, the second module stack 40 includes a heat dissipation and buffer film layer 41, a steel plate (SUS) 42, and a reinforcement layer 43. The heat dissipation and buffer film layer 41 and the reinforcement layer 43 are respectively disposed on opposite sides of the steel plate 42. In detail, the heat dissipation and buffer film layer 41 is disposed on a display side of the steel plate 42, and the reinforcement layer 43 is disposed on a back side of the steel plate 42. The heat dissipation and buffer film layer 41 is attached to one side surfaces of non-back-bent parts of the first part 111 and the second part 112. The reinforcement layer 43 is attached to a side surface of a back-bent part of the second part 112.

Further, the display module 100 further includes a UV adhesive layer 50 and a flexible circuit board 60. In the present embodiment, the UV adhesive layer 50 is disposed on the display panel 20 and covers the bending area BA and a part of the second part 112. A width of the UV adhesive layer 50 covering the second part 112 (excluding the strip-shaped opening 113) is greater than 150 μm. The flexible circuit board 60 is disposed in a terminal area of the non-display area NA of the display panel 20, and is bent back to a back side of the display module 100 after being bent.

In the present embodiment, by means of the design of the material of the back panel the stiffness of the second part 112 is greater than the stiffness of the first part 111. When the back panel 10 is applied to the display module 100, the second part 112 is disposed close to the bending area BA of the display module 100. In this way, the stiffness of the back panel 10 close to an end portion of the bending area BA is effectively enhanced, thereby effectively improving the collapse of the back panel 10 due to insufficient stiffness, and preventing the display panel 20 from cracking or even breaking.

Embodiment II

Figure 8:
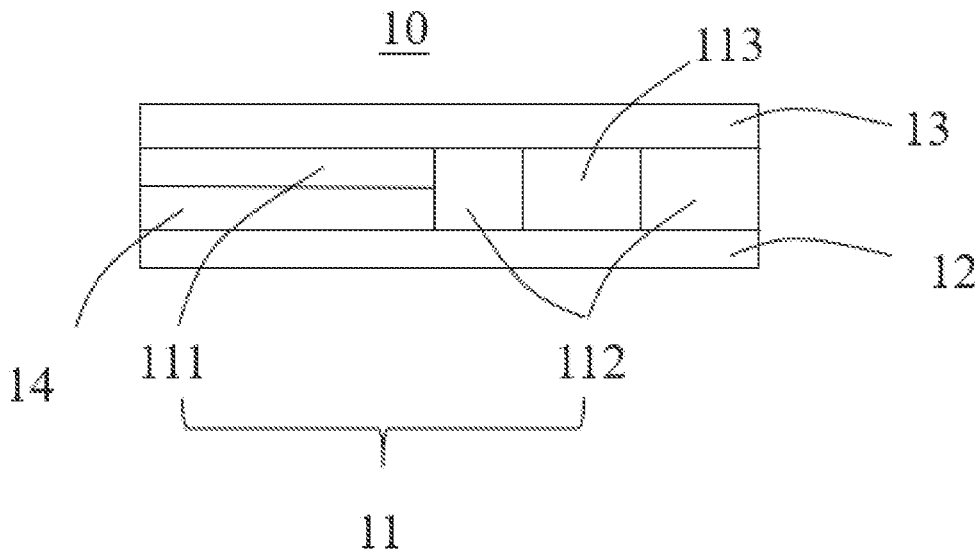
FIG. 8 is a schematic diagram of a structure of a back panel according to a second embodiment of the present disclosure.

Referring to FIG. 8, a structure of the back panel 10 provided in the present embodiment is substantially same as the structure of the back panel 10 provided in Embodiment I, and a difference therebetween is that: the first part 111 and the second part 112 in the present embodiment have different thicknesses. The thickness of the second part 112 is greater than the thickness of the first part 111, and the material of the first part 111 is same as the material of the second part 112.

In detail, in the present embodiment, the thickness of the second part 112 is in a range of 70 μm to 100 μm, and the thickness of the first part 111 is in a range of 10 μm to 50 μm.

Preferably, the thickness of the second part 112 is 90 μm, and the thickness of the first part 111 is in a range of 20 μm to 40 μm.

Preferably, the thickness of the second part 112 may be twice the thickness of the first part 111.

The difference between the structure of the back panel 10 provided in the present embodiment and the structure of the back panel 10 provided in Embodiment I is also that the non-back-bent part of the second part 112 is disposed only corresponding to the non-display area NA instead of being disposed corresponding to the display area AA. In this way, the thickness of the back panel 10 corresponding to the display area AA can be made as thin as possible while ensuring the stiffness of the second part 112. That is to say, the thickness of the first part 111 can be made as thin as possible, so as to meet the requirements of flexible display products, especially foldable products for the bending performance of the display area AA.

In detail, in the present embodiment, the material of the first part 111 and the material of the second part 112 may be selected from any of PI, PET, an optical COP material, an SRF material, and PU. It may be understood that in other embodiments, the materials of the first part 111 and the second part 112 may also adopt other configurations, as long as the stiffness requirements are met.

Preferably, in the present embodiment, the back panel 10 further includes a filling portion 14. The filling portion 14 is disposed between the first part 111 and the protective film 12 to fill a gap between the first part 111 and the protective film 12, so as to flatten the back panel 10. This facilitates transportation and storage of products such as the back panel 10. A sum of thicknesses of the filling portion 14 and the first part 111 is equal to the thickness of the second part 112.

Preferably, a viscosity between the filling portion 14 and the first part 111 is less than a viscosity between the filling portion 14 and the protective film 12. In this way, when the back panel 10 is subsequently assembled into the display module 100, it is convenient for tearing away the filling portion 14 when the protective film 12 is torn away.

Figure 9:
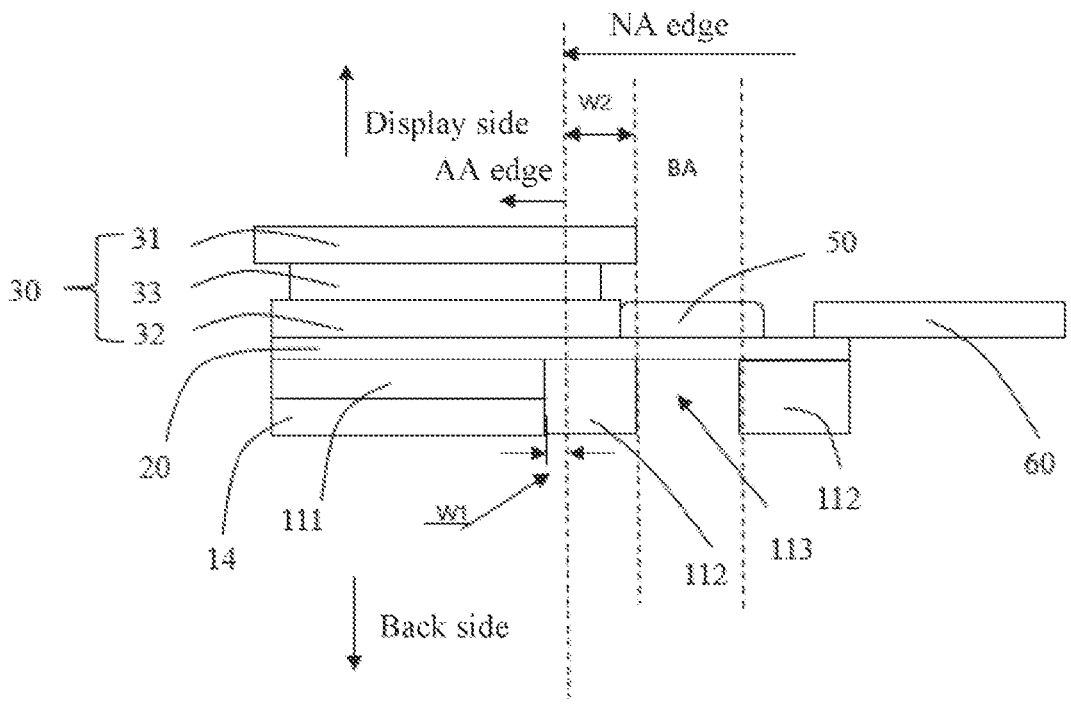
FIG. 9 is a schematic diagram of a part of a structure of a display module before being bent according to a second embodiment of the present disclosure.
Figure 10:
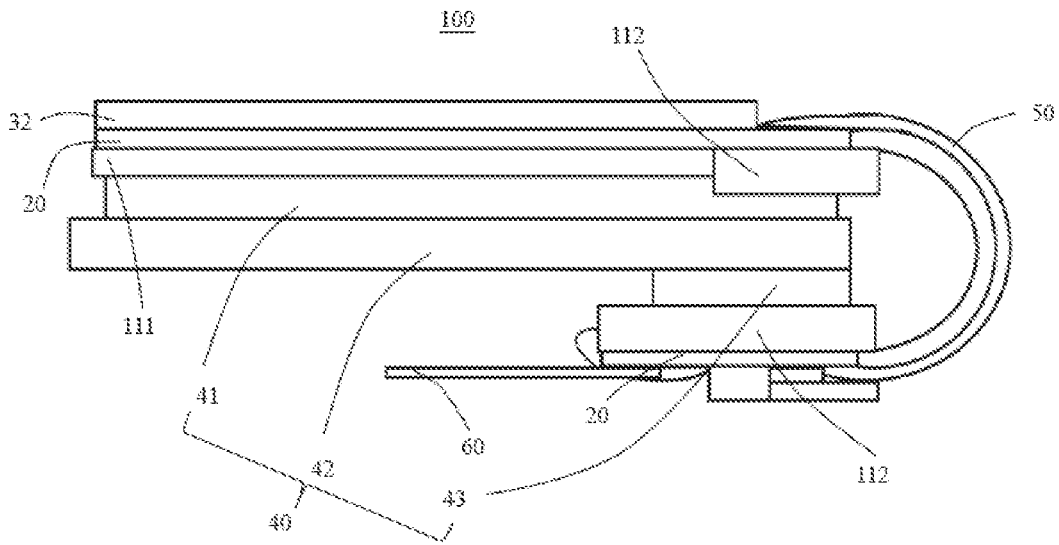
FIG. 10 is a schematic diagram of a structure of the display module shown in FIG. 9 after being bent.

Referring to FIGS. 9 and 10, the structure of the display module 100 provided in the present embodiment is substantially same as the structure of the display module 100 provided in Embodiment I. The difference lies in the structure of the back panel 10. In addition, in the present embodiment, the heat dissipation and buffer film layer 41 fills the blank space formed after the filling portion 14 is torn away, so as to flatten the back panel 10. That is to say, the heat dissipation and buffer film layer 41 is attached to one side surfaces of non-back-bent parts of the first part 111 and the second part 112 that face away from the display panel 20.

In the present embodiment, by means of the design of the thicknesses of different parts of the back panel 10, the stiffness of the second part 112 is greater than the stiffness of the first part 111. When the back panel 10 is applied to the display module 100, the second part 112 is disposed close to the bending area BA of the display module 100, thereby effectively improving the collapse of the back panel 10 due to insufficient stiffness, and preventing the display panel 20 from cracking or even breaking. In addition, by means of the design of the thicknesses of different parts of the back panel 10 in the present embodiment, the thickness of the first part 111 corresponding to the display area AA can be made as thin as possible, so as to meet the requirements of flexible display products, especially foldable products for the bending performance of the display area AA.

Embodiment III

A structure of the back panel 10 provided in the present embodiment is substantially same as the structure of the back panel 10 provided in Embodiment II, and a difference therebetween is that: The material of the first part 111 is different from the material of the second part 112. For detailed illustrations, refer to FIGS. 9 and 10.

In detail, in the present embodiment, the first part 111 adopts PI, and the material of the second part 112 is selected from any of PET, an optical COP material, an SRF material, and polyurethane. It may be understood that in other embodiments, the materials of the first part 111 and the second part 112 may also adopt other configurations, as long as the stiffness requirements are met.

The structure of the display module 100 provided in the present embodiment is substantially same as the structure of the display module 100 provided in Embodiment II, and a difference therebetween is the materials of different parts of the back panel 10.

In the present embodiment, by means of the design of the thicknesses of different parts and the material of the back panel 10, the stiffness of the second part 112 is greater than the stiffness of the first part 111. When the back panel 10 is applied to the display module 100, the second part 112 is disposed close to the bending area BA of the display module 100. In this way, the stiffness of the back panel 10 close to an end portion of the bending area BA is effectively enhanced, thereby effectively improving the collapse of the back panel 10 due to insufficient stiffness, and preventing the display panel 20 from cracking or even breaking.

Figure 11:
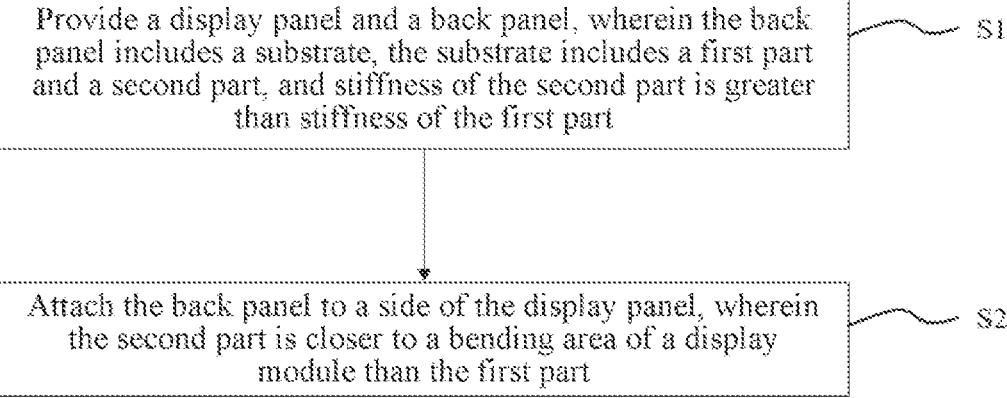
FIG. 11 is a flowchart of a method for manufacturing a display module according to an embodiment of the present disclosure.

Referring to FIG. 11, the present disclosure further provides a manufacturing method for the display module 100. The manufacturing method includes steps below.

S1: Provide a display panel and a back panel, wherein the back panel includes a substrate, the substrate includes a first part and a second part, and stiffness of the second part is greater than stiffness of the first part.

S2: Attach the back panel to a side of the display panel, wherein the second part is closer to a bending area of a display module than the first part.

Step S2 further includes:

tearing off the protective film of the back panel, and attaching a side of the back panel that faces the protective film to the side of the display panel; and tearing off the release film of the back panel.

The structures of the display panel 20 and the back panel 10 are shown in the above embodiments. Details will not be described herein again.

In conclusion, although the present disclosure is disclosed above with reference to preferred embodiments, the foregoing preferred embodiments are not intended to limit the present disclosure. A person of ordinary skill in the art may make various modifications and embellishments without departing from the spirit and scope of the present disclosure. Therefore, the protection scope of the present disclosure falls within the scope defined by the claims.

What is claimed is:

1. A display module, comprising a bending area, a display panel, and a back panel disposed on a side of the display panel, wherein the display panel comprises a display area and a non-display area, the bending area is located in the non-display area and is spaced from an edge of the display area, the back panel comprises a substrate, the substrate comprises a first part and a second part, the first part is disposed corresponding to the display area, the second part is disposed at least corresponding to the non-display area, a strip-shaped opening is provided on the second part, and the strip-shaped opening is provided corresponding to the bending area, the strip-shaped opening divides the second part into a back-bent part and a non-back-bent part, the non-back-bent part is located between the first part and the strip-shaped opening, and stiffness of the second part is greater than stiffness of the first part, wherein the display module further includes a UV adhesive layer and a flexible circuit board, the UV adhesive layer being disposed on the display panel and covers the bending area and a part of the second part, the flexible circuit board being entirely disposed in a terminal area of a portion of the non-display area at a side of the bending area away from the display area, and the flexible circuit board being configured to be at a back side of the display module after the display panel is bent, the flexible circuit board being in direct contact with a surface of a portion of the display panel at the side of the bending area away from the display area.

2. The display module as claimed in claim 1, wherein a thickness of the second part is greater than a thickness of the first part.

3. The display module as claimed in claim 1, wherein the second part is disposed corresponding to the non-display area.

4. The display module as claimed in claim 2, wherein the thickness of the second part ranges from 70 μm to 100 μm, and the thickness of the first part ranges from 10 μm to 50 μm.

5. The display module as claimed in claim 2, wherein the thickness of the second part is twice the thickness of the first part.

6. The display module as claimed in claim 2, wherein the first part and the second part have a same material.

7. The display module as claimed in claim 2, wherein a material of the first part is polyimide (PI), and a material of the second part is selected from any of polyethylene terephthalate (PET), an optical cyclo olefin polymer (COP) material, an SRF material, and polyurethane (PU).

8. The display module as claimed in claim 1, wherein a material of the first part is polyimide (PI), and a material of the second part is selected from any of polyethylene terephthalate (PET), an optical cyclo olefin polymer (COP) material, an SRF material, and polyurethane (PU).

9. The display module as claimed in claim 1, wherein the second part is disposed corresponding to the non-display area and a part of the display area, and a width by which the second part corresponds to the part of the display area ranges from 100 μm to 150 μm.

10. The display module as claimed in claim 1, further comprising a heat dissipation and buffer film layer attached to one side surfaces of the first part and the second part that face away from the display panel.

11. A manufacturing method for a display module, wherein the manufacturing method comprises at least steps of:

providing a display panel and a back panel, wherein the back panel comprises a substrate, the substrate comprises a first part and a second part, a strip-shaped opening is provided on the second part, and the strip-shaped opening is provided corresponding to a bending area of the display module, the strip-shaped opening divides the second part into a back-bent part and a non-back-bent part, the non-back-bent part is located between the first part and the strip-shaped opening, and stiffness of the second part is greater than stiffness of the first part; and attaching the back panel to a side of the display panel, wherein the back panel further comprises a protective film and a release film, the first part and the second part are disposed between the release film and the protective film, and the step of attaching the back panel to the side of the display panel comprises:

tearing off the protective film of the back panel, and attaching a side of the back panel that faces the protective film to the side of the display panel; and tearing off the release film of the back panel;

wherein the display panel comprises a display area and a non-display area, the bending area is located in the non-display area and is spaced from an edge of the display area;

wherein the display module further includes a UV adhesive layer and a flexible circuit board, the UV adhesive layer being disposed on the display panel and covers the bending area and a part of the second part, the flexible circuit board being entirely disposed in a terminal area of a portion of the non-display area at a side of the bending area away from the display area, and the flexible circuit board being configured to be at a back side of the display module after the display panel is bent, the flexible circuit board being in direct contact with a surface of a portion of the display panel at the side of the bending area away from the display area.

12. The manufacturing method as claimed in claim 11, wherein a filling portion is further disposed between the first part and the protective film, a sum of thicknesses of the first part and the filling portion is equal to a thickness of the second part, and a viscosity between the filling portion and the first part is less than a viscosity between the filling portion and the protective film.

13. The display module as claimed in claim 1, wherein a width of the UV adhesive layer covering the second part excluding the strip-shaped opening is greater than 150 μm.

14. The display module as claimed in claim 1, wherein the first part is different in material from the second part.

* * * * *